(12) United States Patent
Fukaya (10) Patent No.: US 7,637,380 B2
(45) Date of Patent: Dec. 29, 2009

(54) TRANSPORTING APPARATUS, TRANSPORTING SYSTEM, AND ELONGATION MECHANISM

(75) Inventor: Noriyasu Fukaya, Ise (JP)

(73) Assignee: Muratec Automation Co., Ltd., Kyoto-Shi (JP)

( * ) Notice: Subject to any disclaimer, the term of this patent is extended or adjusted under 35 U.S.C. 154(b) by 0 days.

(21) Appl. No.: 12/177,427

(22) Filed: Jul. 22, 2008

(65) Prior Publication Data
US 2009/0026164 A1    Jan. 29, 2009

(30) Foreign Application Priority Data
Jul. 23, 2007   (JP) .............................. 2007-190473

(51) Int. Cl.
*B66C 19/00* (2006.01)
(52) U.S. Cl. .............................. 212/332; 74/31; 74/33; 74/109; 414/940
(58) Field of Classification Search ................ 212/331, 212/332; 414/280, 940; 74/31, 33, 109, 74/89.17
See application file for complete search history.

(56) References Cited

U.S. PATENT DOCUMENTS 2,788,905 A * 4/1957 Grove ......................... 414/663
3,432,056 A * 3/1969 Chasar ........................ 414/662

FOREIGN PATENT DOCUMENTS

| EP | 1 547 943 A1 | * | 6/2005 |
| JP | 03-278362 A | * | 12/1991 |
| JP | 11-180505 | | 7/1999 |
| JP | 2005-206371 | | 8/2005 |
| JP | 2006-282303 | | 10/2006 |

* cited by examiner

*Primary Examiner*—Thomas J. Brahan
(74) *Attorney, Agent, or Firm*—Young & Thompson (57) ABSTRACT

A transporting apparatus is provided with: a transporting device (120) having: a loading device (220) which can elongate in an elongation direction toward a side of the track portion; and an elongation mechanism (600) for elongating the loading device. The elongation mechanism is provided with: a first rack (510) fixed to the main body device (210) and a second rack (520) fixed to the loading device, the first rack and the second rack each extending in the elongation direction and facing each other with a space therebetween; and a first pinion (610) engaged with the first rack, a second pinion (620) engaged with the second rack, and an odd number of third pinions (630) engaged between the first and second pinions.

7 Claims, 5 Drawing Sheets

TRANSPORTING APPARATUS, TRANSPORTING SYSTEM, AND ELONGATION MECHANISM

BACKGROUND OF THE INVENTION

1. Field of the Invention

The present invention relates to a transporting apparatus for transporting a transported object, for example, various substrates and the like for manufacturing semiconductor devices, on a track portion, a transporting system including the transporting apparatus and the track portion, and an elongation mechanism used for the transporting apparatus. Here, the "transported object" means a product, an intermediate product, a part, an article, a work, a partly-finished good, a good or the like, or means a box or container for containing such a product or the like, which has been transported or is to be transported by the apparatus.

2. Description of the Related Art

As this type of transporting apparatus, there is a transporting apparatus of an OHT (Overhead Hoist Transport) type, which travels on the track portion, installed on or near the ceiling. Moreover, there is a transporting apparatus that can transfer or load a transported object, placed except under the track portion, i.e. placed on the side of the track portion (hereinafter referred to as "lateral transfer", as occasion demands).

For example, Japanese Patent Application Laying Open NO. Hei 11-180505 discloses a technology which allows the lateral transfer by providing a transferring device, which can move on a horizontal surface, in the lower portion of a transporting carriage. Moreover, Japanese Patent Application Laying Open NO. 2005-206371 discloses a technology which allows the lateral transfer by providing a ceiling buffer on the lateral side of the transporting carriage and by displacing a lift to the ceiling buffer. Furthermore, Japanese Patent Application Laying Open NO. 2006-282303 discloses a technology which allows the lateral transfer by providing an object placing stage on the lateral side of the track.

The transporting apparatus, disclosed in the patent documents, is provided with an elongation mechanism for laterally elongating a loading device, mechanically, using a gear, rack, pinion, motor, and the like, when performing the lateral transfer.

However, there is such a technical problem that it is technically hard to make the elongation mechanism, which is to perform the lateral transfer as described above, extendable with a sufficient length and sufficient strength at the time of elongation, while making the mechanism small enough not to interfere with the travel of the transporting apparatus at the time of non-elongation.

SUMMARY OF THE INVENTION

It is therefore an object of the present invention to provide a transporting apparatus which can be reduced in size and which allows the lateral transfer, a transporting system provided with the transporting apparatus, and an elongation mechanism used for the transporting apparatus.

The above object of the present invention can be achieved by a transporting apparatus provided with: a traveling device traveling on a track portion; and a transporting device having: a main body device mounted on the traveling device; a loading device which can elongate in an elongation direction from the main body device toward a side of the track portion and which can load a transported object; and an elongation mechanism for elongating the loading device in the elongation direction, the elongation mechanism provided with: a first rack fixed to the main body device and a second rack fixed to the loading device, the first rack and the second rack each extending in the elongation direction and facing each other with a space therebetween; and a first pinion engaged with the first rack, a second pinion engaged with the second rack, and an odd number of third pinions engaged between the first and second pinions, the first, second, and third pinions being disposed in the space, the loading device being elongated in the elongation direction by shifting the second rack in the elongation direction with respect to the first rack while rolling the first, second, and third pinions.

According to the transporting apparatus of the present invention, in its operation, firstly, the transported object is carried by the transporting device by that the traveling device travels on the track portion installed on or near the ceiling, for example. The transporting device has: the main body device mounted on the traveling device in a hanging form; the loading device which can elongate from the main body device toward the side of the track portion and which can load or mount the transported object; and the elongation mechanism for elongating the loading device in the elongation direction. Thus it is possible to load and carry the transported object disposed on the lateral side of the track portion. Incidentally, the expression of "elongate in the elongation direction toward the side" herein typically means, but does not strictly mean, the horizontal direction. As long as it deviates from the track portion to the lateral side, it may be obliquely downward or obliquely upward elongation. That is, the loading device may perform the lateral transfer by the typical horizontal elongation, or it may perform the lateral transfer as the anomalistic oblique elongation. Moreover, the loading device can also load or mount the transported object without the elongation.

Here in particular, if the aforementioned lateral transfer is to be performed, the first, second, and third pinions are rolled, which are disposed in the space between the first and second racks. At this time, the number of the third pinions between the first and second pinions is typically the odd number, such as one or three. Thus, the rolling of the first to third pinions means that the second rack engaged with the second pinion is shifted in the elongation direction, with respect to the first rack engaged with the first pinion. In other words, typically the first and second racks change the relative position in the elongation direction, while mutually maintaining the parallel relationship. Then, the loading device with the second rack fixed is elongated in the elongation direction, with respect to the main body device with the first rack fixed.

If there is only one pinion between the first and second racks in the construction of the present invention, the first rack can be elongated in the elongation direction by the rolling of the pinion. In this case, however, the pinion needs to be sandwiched between the first and second racks from the both sides even in the most elongated status, so that it is impossible to further shift the first and second racks in the elongation direction. In other words, it is impossible to shift the first and second racks to the extent that the both racks do not face each other, in the position where the pinion is engaged, which requires the rack that is longer by as much as the overlap of the two racks.

Alternatively, if there are only the first and second pinions, which engage with each other, between the first and second racks in the construction of the present invention, it is impossible to roll the first and second pinions, which rotate oppositely to each other at the engagement position, as long as the pinions are engaged with the first and second racks In the same manner, if there are only the even number of third pinions between the first and second racks in the construction of the present invention, it is impossible again to roll the first to third pinions, as long as the pinions are engaged with the first and second racks.

In the present invention, however, in particular, the first and second rack and the first to third pinions are engaged as described above, so that the first to third pinions can be rolled, and the first and second racks can be shifted in the elongation direction in conjunction with the rolling of the pinions. Moreover, at this time, it is unnecessary to sandwich any one of the pinions between the first and second racks from the both sides. Thus, it is possible to shift the first and second racks to the extent that the both racks do not face each other, in the position where the pinion is engaged. Thus, considering it with the lengths of the racks fixed, the elongatable length can be increased by as much as the intervenient plurality of pinions. In other words, considering it with the elongatable length fixed, it is possible to reduce the size of the elongation mechanism and the size of the transporting apparatus as a whole, extremely efficiently. The short length of the rack requires the shorter length in the elongation direction of the transporting apparatus and the shorter length in the elongation direction of the elongation mechanism at the time of non-elongation, which allows the loading device to elongate farther from the small-sized transporting apparatus.

Incidentally, the elongation of the second rack and the rolling of the first to third pinions, as described above, may be performed by that a rotation driving device, such as a motor, rotates the shaft of any of the pinions, or by that a linear driving device, such as an actuator and a driving belt, for reciprocating the loading device or the second rack in the elongation direction laterally pushes or pulls the loading device or the like.

As explained above, according to the transporting apparatus of the present invention, it is possible to reduce the size and to perform the lateral transfer.

In one aspect of the transporting apparatus of the present invention, the elongation mechanism is further provided with a slider which extends in the elongation direction, which journals or fixes the first, second, and third pinions, and which slides in the elongation direction in conjunction with that the second rack is shifted.

According to this aspect, the first to third pinions, which are journalled or fixed to the slider, are rolled, and the second rack engaged with the second pinion is shifted in the elongation direction with respect to the first rack engaged with the first pinion. For example, if the second rack is shifted in the elongation direction with respect to the first rack by as much as a length corresponding to the rotational amount of the first and second pinions, the slider is shifted in the elongation direction by as much as a length corresponding to the rotational amount of the first pinion. At this time, the first and second racks can be separated in the elongation direction by as much as the existence of the slider, which allows the farther elongation using the same-length racks.

In another aspect of the transporting apparatus of the present invention, the third pinion can be engaged with the first and second pinions at such a position that the third pinion does not interfere with any of the first and second racks.

According to this aspect, the third pinion is engaged with the first and second pinions at the position that the third pinion does not interfere with any of the first and second racks, i.e. at the position that the third pinion does not hit the teeth of the first or second rack so that it does not interfere with the rolling of the first and second pinions. Such a position is typically away in a crossing direction crossing the elongation direction of the rack, and the third pinion is engaged with the engagement with the first and second pinions, which are wider than the racks in the crossing direction, at the position. Therefore, the loading device is shifted in the elongation direction with respect to the first rack, without the third pinion interfering with the second rack, which allows the elongation in the elongation direction.

Alternatively, in another aspect of the transporting apparatus of the present invention, the third pinion has such a shape that the third pinion does not interfere with any of the first and second racks.

According to this aspect, the third pinion has such a shape that the third pinion does not interfere with any of the first and second racks. Such a shape is typically a disc shape with a smaller diameter than those of the first and second pinions. The third pinion is engaged with the first and second pinions without contacting the first and second racks in the space between the first and second racks. Therefore, the loading device is shifted in the elongation direction with respect to the first rack, without the third pinion interfering with the second rack, which allows the elongation in the elongation direction.

The above object of the present invention can be also achieved by a transporting system provided with: the transporting apparatus of the present invention described above (including its various aspects); and the track portion.

According to the transporting system of the present invention, since it is provided with the transporting apparatus of the present invention, it is possible to reduce the size of the transporting apparatus which can perform the lateral transfer on the track portion.

The above object of the present invention can be also achieved by an elongation mechanism for elongating an elongatable device, which can elongate in an elongation direction from a main body device toward a side of the main body device in the elongation direction, the elongation mechanism provided with: a first rack fixed to the main body device and a second rack fixed to the elongatable device, the first rack and the second rack each extending in the elongation direction and facing each other with a space therebetween; and a first pinion engaged with the first rack, a second pinion engaged with the second rack, and an odd number of third pinions engaged between the first and second pinions, the first, second, and third pinions being disposed in the space, the extendable device being elongated in the elongation direction by shifting the second rack in the elongation direction with respect to the first rack while rolling the first, second, and third pinions.

According to the elongation mechanism of the present invention, as in the case of the transporting apparatus of the present invention described above, when the elongatable device is elongated, the first and second pinions and the third pinion are rolled, wherein they are disposed in the space between the first and second racks. Then, the elongatable device with the second rack fixed is elongated in the elongation direction, with respect to the main body device with the first rack fixed. As a result, it is possible to reduce the entire elongation mechanism in size, and it is possible to perform the elongation of the elongatable device whose various applications can be considered, such as the elongation of the loading device in the lateral transfer, for example.

The nature, utility, and further features of this invention will be more clearly apparent from the following detailed description with reference to preferred embodiments of the invention when read in conjunction with the accompanying drawings briefly described below.

DETAILED DESCRIPTION OF THE PREFERRED EMBODIMENT

The embodiment of the present invention will be explained with reference to the drawings hereinafter.

Figure 1:
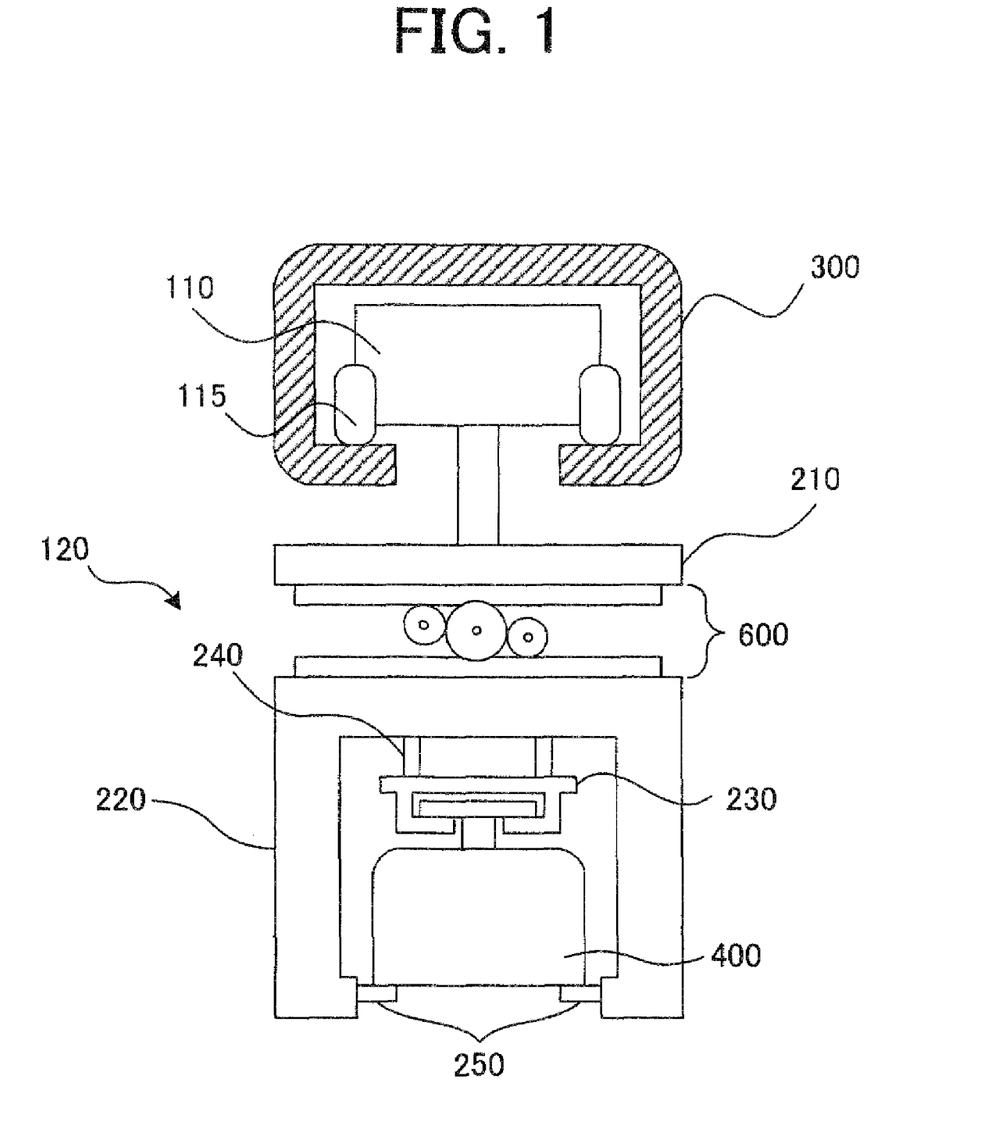
FIG. 1 is a side view showing the structure of a transporting system.

Firstly, the structure of a transporting system in an embodiment will be explained with reference to FIG. 1. FIG. 1 is a side view showing the structure of the transporting system.

In FIG. 1, the transporting system in the embodiment is provided with: a track portion 300; a traveling device 110 having traveling rollers 115; and a transporting device 120 having a main body device 210, a loading device 220, a grip device 230, a lifting belt 240, a safety catcher device 250, and an elongation mechanism 600.

The track portion 300 is installed on or near the ceiling, for example, and is provided with metal, such as aluminum and stainless.

The traveling device 110 travels in the track portion 300 by a not-illustrated motor or the like rotating the traveling rollers 115. Alternatively, a linear motor may be installed, and the traveling rollers may be rotated on the propulsion principle of the linear motor.

In the transporting device 120, the main body device 210 is mounted such that it is hanging from the traveling device 110, and the loading device 220 is provided through the elongation mechanism 600 with respect to the main body device 210. The loading device 220 can be displaced (i.e. extended) laterally with respect to the main body device 210, by virtue of the elongation mechanism 600. Incidentally, the structure and operation of the elongation mechanism 600 will be detailed later. The grip device 230 is connected to the loading device 220 by the lifting belt 240, and it holds a transported object 400. The lifting belt 240 performs winding (or hoisting) and unwinding (or dehoisting) to lift the grip device 230. The safety catcher device 250 supports the transferred transported object 400 from the bottom side, as shown in FIG. 1, to prevent its falling. Incidentally, if the transported object 400 is transferred, the safety catcher device 250 can be reduced in size in order not to interfere with the transfer, or it can be accommodated within the loading device 200

Figure 2:
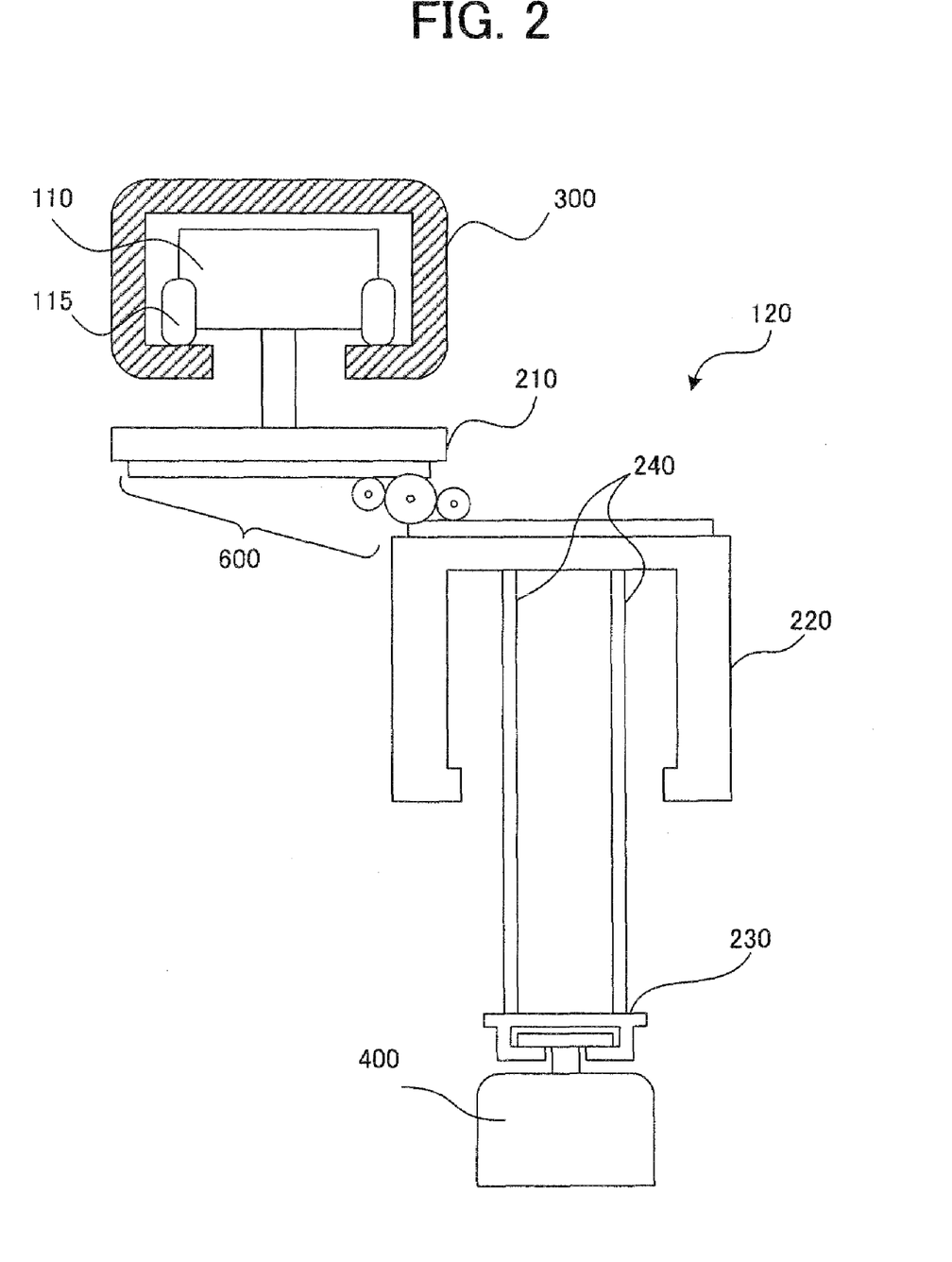
FIG. 2 is a side view showing the structure of the transporting system when performing lateral transfer.

Next, the carriage operation of the transporting system in the embodiment will be explained with reference to FIG. 1 and FIG. 2. FIG. 2 is a side view showing the structure of the transporting system when performing lateral transfer. Incidentally, it is exemplified the case that the transporting device 120 performs the lateral transfer.

In the operation of the transporting system in the embodiment, firstly, the transporting device 120, to which the transported object is not transferred or loaded yet, is moved to a position where the transported object is to be transferred or loaded by the traveling device 110. At this time, the lifting belt 240 is wound up, and the grip device 230 is accommodated within the loading device 220 (refer to FIG. 1).

In FIG. 2, when the traveling device 110 is moved, the loading device 220 is displaced (i.e. elongated) laterally by the elongation mechanism 600. This allows the lateral transfer of the transported object 400. Then, the lifting belt 240 is unwound to thereby lower the grip device 230, which then holds the transported object 400.

Back in FIG. 1, when the transported object 400 is held by the grip device 230, the lifting belt 240 is wound up, and the grip device 230 returns to the original position. Then, the loading device 220 is displaced in the opposite direction (i.e. to the left in FIG. 2) to that in the elongation, and it returns to the position before the elongation. Then, the traveling device 110 travels again in the status shown in FIG. 1, to thereby perform the transportation of the transported object 400.

As described above, since the loading device 220 can be elongated by the elongation mechanism 600, the lateral transfer of the transported object 400 can be performed. Moreover, the longer elongation distance the elongation mechanism 600 has, the more widely the lateral transfer can be performed. That is, it is possible to load (i.e., laterally transfer) the transported object 400 located farther from the track portion 300. Moreover, considering this with the elongation distance fixed, a smaller apparatus can realize the same elongation distance.

The loading device 220 in the embodiment realizes the relatively long elongation distance because of the elongation mechanism 600. Hereinafter the elongation mechanism 600 in the embodiment will be explained in details, using a comparison example.

Figure 3:
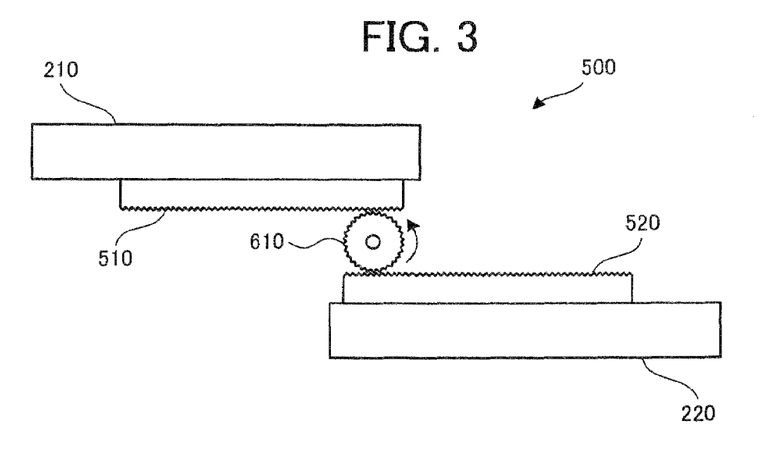
FIG. 3 is a side view showing a comparison example of an elongation mechanism of a loading device.

Firstly, the structure and operation of an elongation mechanism 500 in the comparison example will be explained with reference to FIG. 3. FIG. 3 is a side view showing the comparison example of the elongation mechanism of the loading device. Incidentally, in FIG. 3, for convenience of explanation, members related to the elongation mechanism 500 are illustrated, with other than the above members being omitted as occasion demands.

In FIG. 3, the elongation mechanism 500 in the comparison example is provided with: a first rack 510 fixed on the main body device 210; a second rack 520 fixed on the loading device 220; and a first pinion 610 engaged with each of the first rack 510 and the second rack 520.

According to the elongation mechanism 500 in the comparison example, the first pinion 610 is rolled in an arrow direction in FIG. 3, to thereby displace the first pinion 610 and the second rack 520 in an elongation direction (i.e. to the right in FIG. 3).

However, in the elongation mechanism 500 in the comparison example, the first pinion 610 is held by the first rack 510 and the second rack 520 therebetween even in the most elongated status shown in FIG. 3, so that it is hard to further shift the first rack 510 and the second rack 520 in the elongation direction. In other words, it is hard to shift the first rack 510 and the second rack 520 to the extent that the both racks do not face each other, in the position where the first pinion 610 is engaged.

Figure 4:
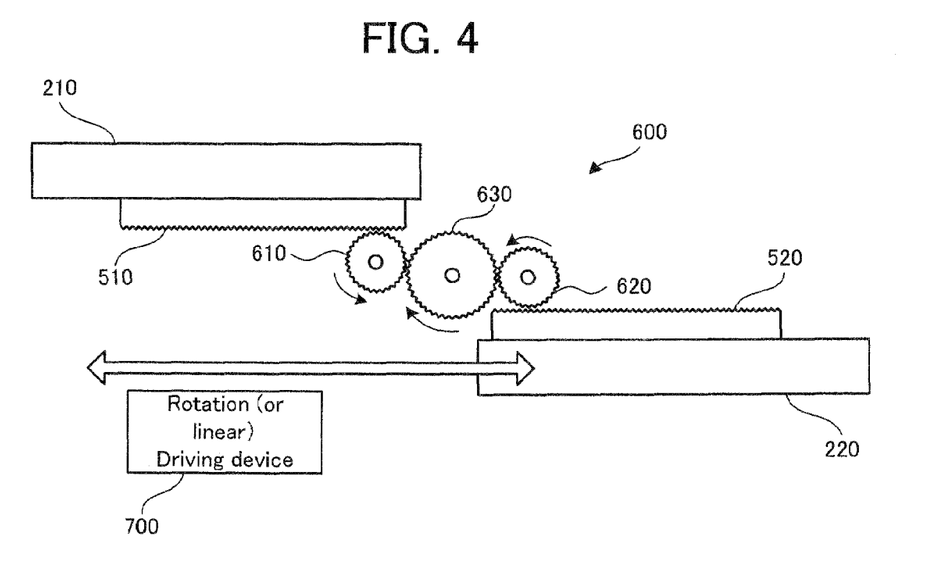
FIG. 4 is a side view showing the structure of the elongation mechanism of the loading device in an embodiment.

Next, the structure and operation of the elongation mechanism 600 in the embodiment will be explained with reference to FIG. 4. FIG. 4 is a side view showing the structure of the elongation mechanism of the loading device in the embodiment. Incidentally, in FIG. 4, as in FIG. 3, the illustration of some members is omitted as occasion demands. Moreover, in the explanation below, the repetitive structure and operation of the elongation mechanism 500 in the comparison example described above will be omitted as occasion demands.

In FIG. 4, the elongation mechanism 600 in the embodiment is provided with: the first rack 510 fixed on the main body device 210; the second rack 520 fixed on the loading device 220; the first pinion 610 engaged with the first rack 510; a second pinion 620 engaged with the second rack 520; and a third pinion 630 engaged with each of the first pinion 610 and the second pinion 620.

According to the elongation mechanism 600 in the embodiment, the first pinion 610, the second pinion 620, and the third pinion 630 are rolled in respective arrow directions in FIG. 4 (i.e. counterclockwise for the first pinion 610 and the second pinion 620, and clockwise for the third pinion 630), to thereby displace the first pinion 610, the second pinion 620, the third pinion 630, and the second rack 520 in the elongation direction (i.e. to the right in FIG. 4). Due to the operation of the elongation mechanism 600 described above, the loading device 220 is displaced with respect to the main body device 210, to thereby perform the elongation.

Incidentally, the aforementioned elongation operation can be performed by that a rotation driving device 700, such as a motor, rotates any of the shaft of the first pinion 610, or by that a linear driving device, such as an actuator, a driving belt, and a linear slider, for reciprocating the second rack 520 in the elongation direction laterally pushes or pulls the loading device or the like.

Here, the elongation mechanism 600 in the embodiment, when elongating most as shown in FIG. 4, can elongate more than the elongation mechanism 500 in the comparison example, by as much as the second pinion 620 and the third pinion 630 added (i.e. by the radius of the first pinion+the radius of the second pinion 620+the diameter of the third pinion 630). Moreover, considering this with the elongatable length fixed, even if the first rack 510 and the second rack 520 are reduced in length, the same elongation distance can be realized. Thus, it is possible to reduce the size of the elongation mechanism 600 and the size of the transporting apparatus as a whole, extremely efficiently.

Figure 5:
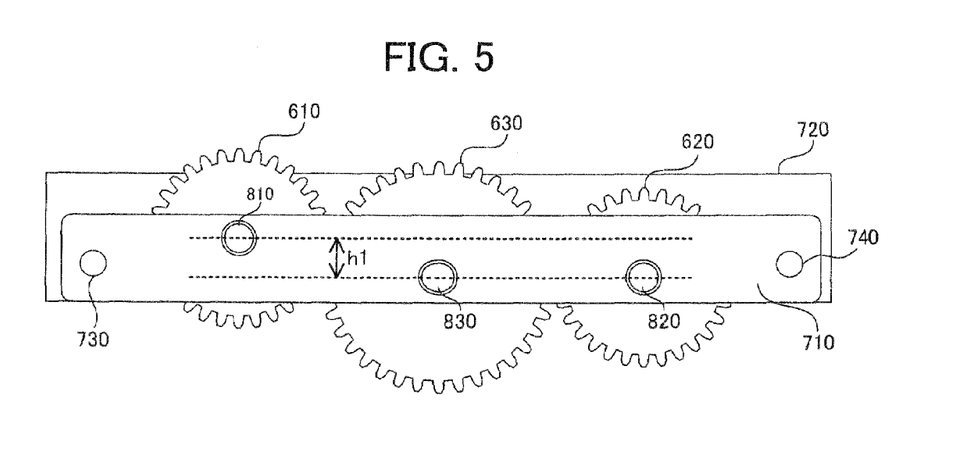
FIG. 5 is a partial enlarged side view showing the structure of pinions in the elongation mechanism.
Figure 6:
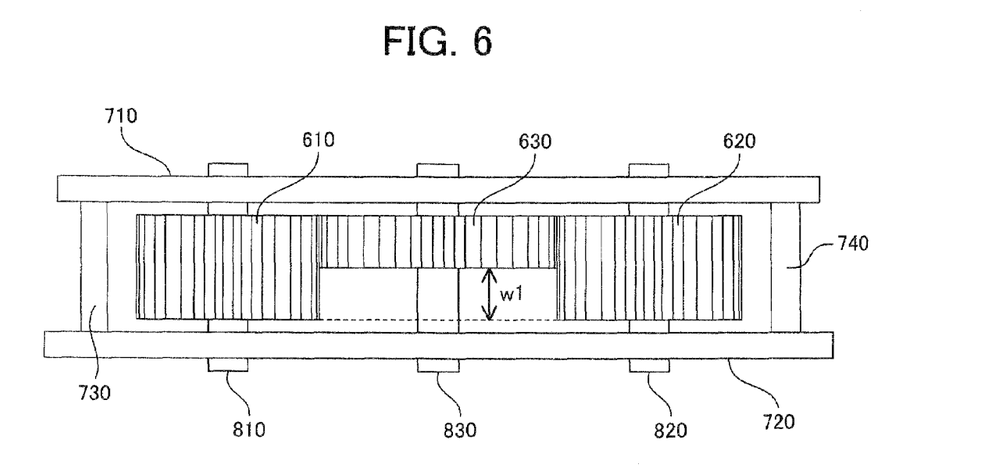
FIG. 6 is a partial enlarged bottom view showing the structure of pinions in the elongation mechanism.
Figure 7:
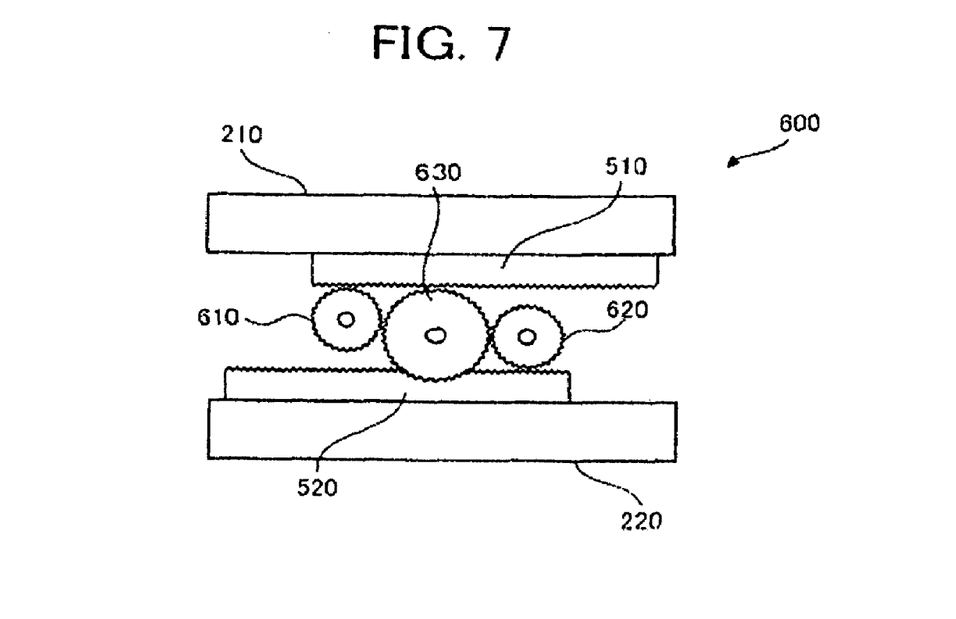
FIG. 7 is a side view showing the structure of the loading device at the time of non-elongation.
Figure 8:
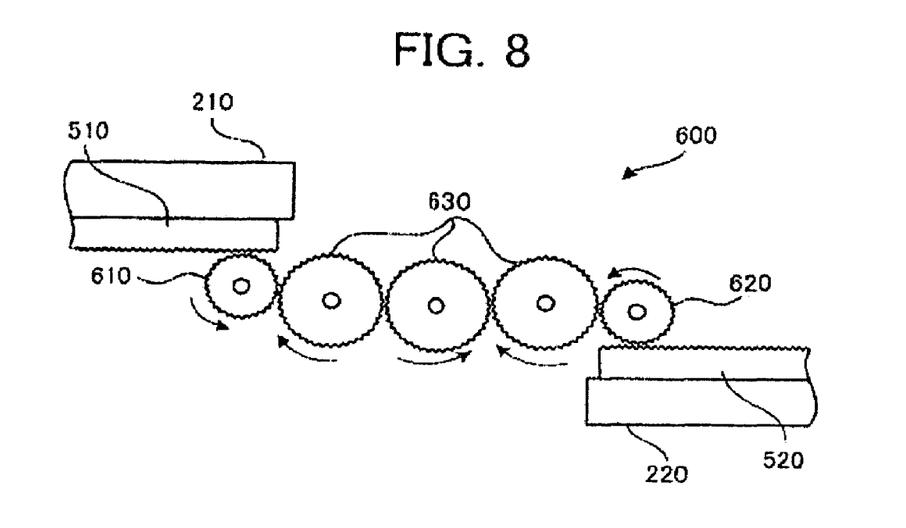
FIG. 8 is a side view showing a modified example of the elongation mechanism.

Next, the structure of the pinions of the elongation mechanism 600 in the embodiment described above will be explained in details, with reference to FIG. 5 to FIG. 8. FIG. 5 is a partial enlarged side view showing the structure of the pinions in the elongation mechanism. FIG. 6 is a partial enlarged bottom view showing the structure of pinions in the elongation mechanism. FIG. 7 is a side view showing the structure of the loading device at the time of non-elongation. FIG. 8 is a side view showing a modified example of the elongation mechanism.

In FIG. 5 and FIG. 6, in the elongation mechanism 600 in the embodiment, the first pinion 610, the second pinion 620, and the third pinion 630 are journalled or fixed such that they are sandwiched between a first clamping plate 710 and a second clamping plate 720, which are one example of the "slider" of the present invention. The first pinion 610, the second pinion 620, and the third pinion 630 are fixed to the first clamping plate 710 and the second clamping plate 720, by their respective rotation shafts 810, 820, and 830. The first clamping plate 710 and the second clamping plate 720 are connected with each other by screws 730 and 740. Moreover, the upper edge part of the second clamping plate 720 is supported by a not-illustrated linear slide member, slidably in a horizontal direction to the main body device 210 (refer to FIG. 4). The lower edge part of the second clamping plate 720 is also supported by a not-illustrated linear slide member, slidably in a horizontal direction to the loading device 220 (refer to FIG. 4).

When the elongation is performed, the first clamping plate 710 and the second clamping plate 720 are also displaced in the elongation direction with each of the pinions. Since the first clamping plate 710 and the second clamping plate 720 journal or fix each of the pinions, the first rack 510 and the second rack 520 (refer to FIG. 4) can be separated in the elongation direction by as much as the lengths of the first clamping plate 710 and the second clamping plate 720, which allows the further elongation.

In FIG. 5, the first pinion 610 is journalled or fixed at an h1-higher position with respect to the second pinion 620 and the third pinion 630. This is not to contact the first pinion 610 with the second rack 520, or not to contact the second pinion 620 with the first rack 510 if the elongation mechanism 600 is not elongated and if the first rack 510 and the second rack 520 are in the positional relation that they face each other as shown in FIG. 7. Incidentally, here, the third pinion 630 has the same height as that of the second pinion 620 have the same height; however, the height of the third pinion 630 is not particularly limited if it is in the range that the third pinion 630 can engage with the first pinion 610 and the second pinion 620.

In FIG. 6, the width of the third pinion 630 is less than those of the first pinion 610 and the second pinion 620, by as much as a width w1. Thus, there is a gap with the width of w1 between the third pinion 630 and the second clamping plate 720. This is because the third pinion 630 may not be contacted with the first rack 510 or the second rack 520 if the elongation mechanism 600 is not elongated and if the third pinion 630 and the first rack 510 or the second rack 520 are in the positional relationship that they overlap each other, as shown in FIG. 7. That is, the elongation can be performed without the contact with the third pinion 630 by engaging the first rack 510 and the second rack 520 with the first pinion 610 or the second pinion 620 in the gap portion with the width of w1 described above.

As described above, it is possible to increase the diameter of the third pinion 630 by not contacting the third pinion 630 with the first rack 510 or the second rack 520. By increasing the diameter of the third pinion 630, the elongation distance can be also increased by that much. Moreover, it is also possible to achieve an effect of smoothing the motion of the pinions.

Incidentally, as described above, if the diameter of the third pinion 630 is not increased, the contact can be prevented by making the diameter of the third pinion 630 small enough to contact neither the first rack 510 nor the second rack 520. In this case, the gap described above does not have to be provided. In other words, the third pinion 630 has the same width as those of the first pinion 610 and the second pinion 620.

As shown as a modified example in FIG. 8, the number of the third pinions 630 does not have to be one as described above if it is an odd number. For example, as shown in FIG. 8, if there are three third pinion 630 provided, the rolling directions of the pinions in the elongation are as shown with arrows in the figure. That is, if the number of the third pinions 630 is the odd number, it is possible to set the rolling directions of the first pinion 610 and the second pinion 620 to be equal to each other. Thus, the first rack 510 and the second rack 520 are displaced in the direction approaching to or going away from each other, so that the aforementioned elongation operation can be performed.

As explained above, according to the elongation mechanism 600 in the embodiment, it is possible to reduce the elongation mechanism 600 in size as a whole, and it is possible to elongate the elongatable device whose various applications can be considered, such as the elongation of the loading device 220. Moreover, according to the transporting apparatus or transporting system, having the elongation mechanism 600, it is possible to reduce the apparatus or system in size as a whole, and it is also possible to perform the lateral transfer of the transported object.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2007-190473 filed on Jul. 23, 2007 including the specification, claims, drawings and summary is incorporated herein by reference in its entirety.

What is claimed is:

1. A transporting apparatus comprising:
    a track portion, configured to be installed on or near a ceiling;
    a traveling device traveling on the track portion; and
    a transporting device,
    wherein the transporting device comprises,
        a main body device mounted on said traveling device,
        a loading device configured to i) elongate in an elongation direction from the main body device toward a side of the track portion and to ii) load a transported object,
        a grip device configured to hold the transported object,
        a lifting belt connecting the grip device to the loading device and configured to lift the grip device, and
        an elongation mechanism configured to elongate each of the loading device, the grip device and the lifting belt together in the elongation direction,
    wherein the elongation mechanism comprises,
        a first rack fixed to the main body device,
        a second rack fixed to the loading device, the first rack and the second rack each extending in the elongation direction and facing each other with a space therebetween,
        a first pinion engaged with the first rack,
        a second pinion engaged with the second rack, and
        an odd number of third pinions engaged between the first and second pinions, the first, second, and third pinions being disposed in the space,
    wherein a first axis of rotation of the first pinion is fixed at a position vertically offset from a second axis of rotation of the second pinion by a predetermined vertical distance h1, the first pinion positioned such to have no contact with the second rack, and the second pinion positioned such to have no contact with the first rack, and
    wherein the loading device is configured to elongate in the elongation direction by shifting the second rack in the elongation direction with respect to the first rack while rolling the first, second, and third pinions.

2. The transporting apparatus according to claim 1, wherein the elongation mechanism further comprises a slider extending in the elongation direction, configured to journal or fix the first, second, and third pinions, and configured to slide in the elongation direction in conjunction the shifting of the second rack.

3. The transporting apparatus according to claim 1, wherein the third pinion is engageable with the first and second pinions at a position such that the third pinion does not come into contact with any of the first and second racks.

4. The transporting apparatus according to claim 1, wherein the third pinion has a diameter and a thickness configured such that the third pinion does not come into contact with any of the first and second racks.

5. A transporting system comprising:
    a transporting apparatus; and
    a track portion, configured to be installed on or near a ceiling,
    wherein said transporting apparatus comprises a traveling device configured to travel on the track portion and a transporting device,
    wherein the transporting device comprises a main body device mounted on said traveling device, a loading device configured to i) elongate in an elongation direction from the main body device toward a side of the track portion and to ii) load a transported object, a grip device configured to hold the transported object, a lifting belt connecting the grip device to the loading device and configured to lift the grip device, and an elongation mechanism configured to elongate the loading device in the elongation direction,
    wherein the elongation mechanism comprises,
    a first rack fixed to the main body device,
    a second rack fixed to the loading device, the first rack and the second rack each extending in the elongation direction and facing each other with a space therebetween,
    a first pinion engaged with the first rack,
    a second pinion engaged with the second rack, and
    an odd number of third pinions engaged between the first and second pinions, the first, second, and third pinions being disposed in the space,
    wherein a first axis of rotation of the first pinion is fixed at a position vertically offset from a second axis of rotation of the second pinion by a predetermined vertical distance h1, the first pinion positioned such to have no contact with the second rack, and the second pinion positioned such to have no contact with the first rack, and
    wherein the loading device is configured to elongate in the elongation direction by shifting the second rack in the elongation direction with respect to the first rack while rolling the first, second, and third pinions.

6. A transporting apparatus comprising:
    a track portion (300), configured to be suspended from a ceiling;
    a mobile traveling device (110) mounted to the track portion (300) and configured to travel along a length of the track portion (300);
    a transporting body (210) mounted to a bottom portion of the traveling device (110);
    a lateral extension mechanism (600), configured to retractably extend in a lateral direction, a top portion of the lateral extension mechanism (600) connected to a bottom portion of the transporting body (210);
    a loading device (220) connected to a bottom portion of the lateral extension mechanism (600);
    a lifting belt (240) connected to the loading device (220); and
    a grip device (230) connected to the lifting belt (240) and configured to hold a transported object,
    wherein the lifting belt (240) is configured to lift the grip device (230),
    wherein the lateral extension mechanism (600) comprises a first rack (510) fixed to the transporting body (210), a second rack (520) fixed to the loading device (220), a first pinion engaged with the first rack, a second pinion engaged with the second rack, and an odd number of third pinions engaged between the first and second pinions, wherein the first rack and the second rack face each other forming a space therebetween, and each extend in the lateral direction, wherein the first, second, and third pinions are disposed in the space between the first and second racks, wherein a first axis of rotation of the first pinion is fixed at a position vertically offset from a second axis of rotation of the second pinion by a predetermined vertical distance h1, the first pinion positioned such to have no contact with the second rack, and the second pinion positioned such to have no contact with the first rack, and wherein the loading device is configured to be reversibly displaced in the lateral direction by shifting the second rack of the lateral extension mechanism in the lateral direction with respect to the first rack of the lateral extension mechanism while rolling the first, second, and third pinions.

7. The transporting apparatus according to claim 6, wherein the transporting body is mounted to hang beneath the portion of the traveling device.

* * * * *